United States Patent
Antoniadis et al.

(10) Patent No.: US 6,582,756 B1
(45) Date of Patent: Jun. 24, 2003

(54) METHOD AND APPARATUS FOR FABRICATING POLYMER-BASED ELECTROLUMINESCENT DISPLAYS

(75) Inventors: Homer Antoniadis, Mountain View, CA (US); Hoyle Curtis, Loveland, CO (US); Ronald L. Moon, Atherton, CA (US); Daniel B. Roitman, Menlo Park, CA (US); James R. Sheats, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/717,655

(22) Filed: Nov. 21, 2000

Related U.S. Application Data

(62) Division of application No. 09/363,964, filed on Jul. 29, 1999, now Pat. No. 6,174,613.

(51) Int. Cl.$^7$ .............................. B05D 5/12; B05D 5/06; B05D 1/36
(52) U.S. Cl. ........................... 427/66; 427/68; 427/162; 427/402; 427/421
(58) Field of Search .......................... 427/66, 68, 162, 427/421, 402

(56) References Cited

U.S. PATENT DOCUMENTS

| | | | | |
|---|---|---|---|---|
| 4,684,353 A | * | 8/1987 | DeSouza | 445/51 |
| 5,701,055 A | * | 12/1997 | Nagayama et al. | 313/504 |
| 5,902,688 A | * | 5/1999 | Antoniadis et al. | 428/690 |
| 5,902,689 A | * | 5/1999 | Vleggaar et al. | 428/690 |
| 5,948,552 A | * | 9/1999 | Antoniadis et al. | 428/690 |
| 5,972,419 A | * | 10/1999 | Roitman | 427/66 |
| 6,016,845 A | * | 1/2000 | Quigley et al. | 138/125 |
| 6,146,225 A | * | 11/2000 | Sheats et al. | 445/24 |
| 6,210,814 B1 | * | 4/2001 | Thompson et al. | 428/690 |
| 6,221,438 B1 | * | 4/2001 | Matthies | 427/466 |

OTHER PUBLICATIONS

Yang et al., "Enhanced performance of polymer light–emitting diodes using high–surface area polyaniline network electrodes," J. Appl. Phys., Jan. 15, 1995, vol. 77, No. 2, pp. 694–698.*

* cited by examiner

*Primary Examiner*—Michael Barr

(57) ABSTRACT

A method for fabricating an electroluminescent display and the substrate and apparatus used therein. The display is preferably constructed on a pre-constructed substrate that includes a flexible base layer having a conducting surface on one side thereof. The base layer is impermeable to oxygen and water. The substrate includes a plurality of wells defined by a barrier layer, each well having an electrode layer connected electrically with the conducting surface. A removable protective layer covering the wells protects the electrode layer from attack by oxygen and water prior to being utilized to make the display. In one embodiment, each of the wells also contains an electron transfer layer in contact with the electrode layer.

6 Claims, 3 Drawing Sheets

METHOD AND APPARATUS FOR FABRICATING POLYMER-BASED ELECTROLUMINESCENT DISPLAYS

CROSS REFERENCE TO RELATED APPLICATION(S)

This is a divisional of copending application Ser. No. 09/363,964 filed on Jul. 29, 1999 now U.S. Patent No. 6,174,613.

FIELD OF THE INVENTION

The present invention relates to display devices, and more particularly, to displays utilizing polymer-based electroluminescent devices.

BACKGROUND OF THE INVENTION

Polymer-based electroluminescent devices (PLEDs) have the potential for providing inexpensive alternatives to semiconductor-based LEDs. PLEDs may be fabricated by coating the appropriate surfaces with an organic polymer, and hence, do not require the use of high cost fabrication systems such as those utilized in the fabrication of semiconductor devices. A simple PLED may be constructed from an electroluminescent layer sandwiched between an electron injection electrode and a hole injection electrode. More complicated devices utilize electron and hole transport layers between the above mentioned electrodes and the electroluminescent layer.

In principle, PLEDs can be utilized to generate inexpensive displays that display a single fixed image of the type used in point of sale advertising. Such a display would be self-illuminating, and hence, would replace transparencies that are mounted on a light-box. If a conventional display is used, the image must be stored in a memory external to the display and the display operated in a mode in which the stored image is continuously scanned into the display. The pixels of the display must be individually addressable which further increases the cost of the display.

In spite of the lower construction costs inherent in PLEDs, multicolor displays based on such devices are still quite costly to fabricate. To construct a multicolor display, a patterned deposition of each of a plurality of electroluminescent compounds must be performed. In prior art fabrication systems, a series of masking operations is required to protect the areas that are not to receive a particular electroluminescent compound. The electroluminescent compound is then deposited using vapor deposition, dipping, or spin casting. The mask is then removed and the next mask constructed using conventional photoresist techniques. Each masking operation increases the fabrication cost and reduces the device yield. In addition, the equipment and expertise needed to operate that equipment is of the type found in semiconductor fabrication facilities. It would be advantageous to provide a system that could be operated by printers and the like.

Broadly, it is the object of the present invention to provide an improved display based on PLEDs and a method and apparatus for constructing the same.

It is a further object of the present invention to provide a display that may be more inexpensively fabricated than prior art displays.

It is a still further object of the present invention to provide an improved method for fabricating PLED displays that does not require expertise in semiconductor fabricating techniques.

These and other objects of the present invention will become apparent to those skilled in the art from the following detailed description of the invention and the accompanying drawings.

SUMMARY OF THE INVENTION

The present invention is a method for fabricating an electroluminescent display and the substrate and apparatus used therein. The display is preferably constructed on a pre-constructed substrate that includes a flexible base layer having a conducting surface on one side thereof. The base layer is impermeable to oxygen and water. The substrate includes a plurality of wells defined by a barrier layer, each well having an electrode layer connected electrically with the conducting surface. A removable protective layer covering the wells protects the conductive layer from attack by oxygen and water prior to being utilized to make the display. The electrode layer preferably includes a material chosen from a group of metals having a work function lower than 3.5 eV. This metal can be, for example, an alkali, alkaline earth or rare earth metal. In some cases, instead of a low work function metal, a metal layer of Ag or Al can be used which is coated with a thin layer of suitable alkali or alkaline earth oxide or fluoride, such as $CaO$, $Li_2O$, $MgO$, $LiF$, $MgF_2$, $CsF$, or $CaF_2$. In one embodiment, each of the wells also contains an electron transport layer in contact with the electrode layer. The electron transport layer includes a material that improves the efficiency of the injection of electrons from the electrode layer into the electroluminescent layer of the display. The display is fabricated by moving a first dispenser relative to the substrate so as to quantitatively deposit a first electroluminescent material on the substrate, different amounts of the first electroluminescent material being deposited at different locations on the substrate in response to signals defining an illumination pattern to be generated by the display. A conducting material is deposited on the first electroluminescent material. In color displays, a second electroluminescent material is also deposited, the second electroluminescent material emitting light at a different wavelength than the first electroluminescent material. In the preferred embodiment of the present invention, the conducting materials include a hole transport material that facilitates the injection of holes into the first electroluminescent material. A non-luminescent material, which is preferably an electrical insulator, can be deposited in wells at locations on the display that are not to emit light prior to depositing the conductive material.

DETAILED DESCRIPTION OF THE INVENTION

Figure 1:
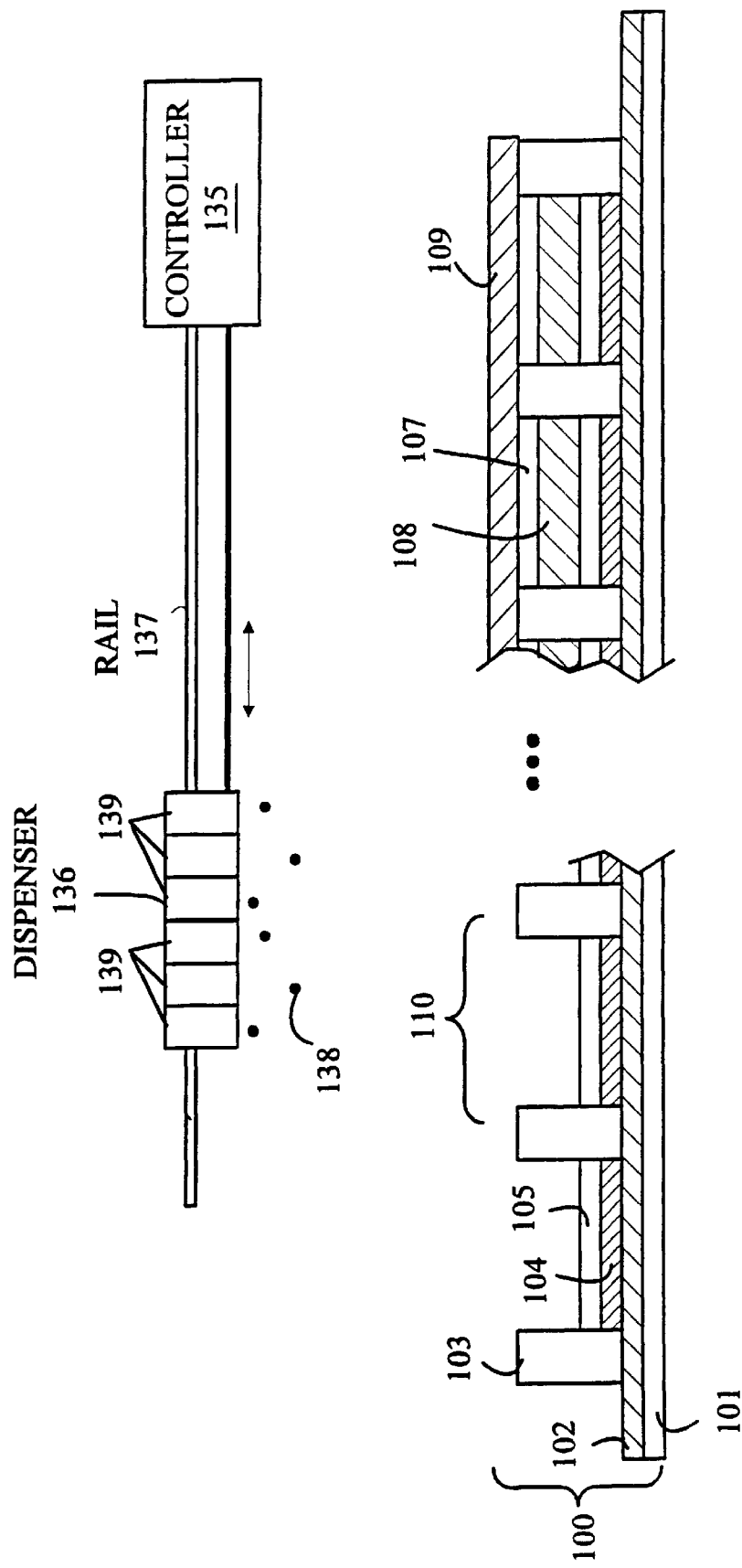
FIG. 1 is a cross-sectional view of a partially constructed display according to the present invention.

The manner in which the present invention achieves its advantages may be more easily understood with reference to FIG. 1, which illustrates the fabrication of a display 100 according to the present invention. FIG. 1 is a cross-sectional view of display 100 part of the way through the fabrication process. Display 100 is constructed from a plurality of pixels 110. Each pixel is a light-emitting element defined by a boundary wall 103 that contains the various materials that make up the pixel. The various pixels are constructed on a flexible substrate 101 having a conducting layer 102 thereon. Layer 102 provides the electrical connection to the bottom electrode in each pixel. The substrate/electrode layer combination must be impermeable to water and oxygen to protect the cathode layer 104 that is deposited on top of the electrode layer.

In the preferred embodiment of the present invention, the cathode layer 104 associated with each pixel is deposited at the bottom of a well defined by boundary wall 103. Cathode 104 is preferably constructed from a metal with a work function lower than 3.5 eV. This metal can be, for example, an alkali, alkaline earth or rare earth metal. In some cases, instead of a low work function metal, a metal layer of Ag or Al can be used which is coated with a thin layer of suitable alkali or alkaline earth oxide or fluoride, such as CaO, $Li_2O$, MgO, LiF, $MgF_2$, CsF, or $CaF_2$. These cathode materials are highly reactive. Accordingly, the substrate/electrode layer must be impermeable to oxygen and water as described above.

An electron transport layer 105 is then deposited on top of the cathode layer. Electron transport layer 105 improves the efficiency of the injection of electrons from cathode 104 into electroluminescent layer 108 by providing a material that has an energy band between that of the electroluminescent layer material and that of the cathode. In addition, electron transport layer 105 helps to protect the cathode material from moisture and oxidization during the period of time in which the cathode/electron transport layer is so exposed for further depositions.

Figure 2:
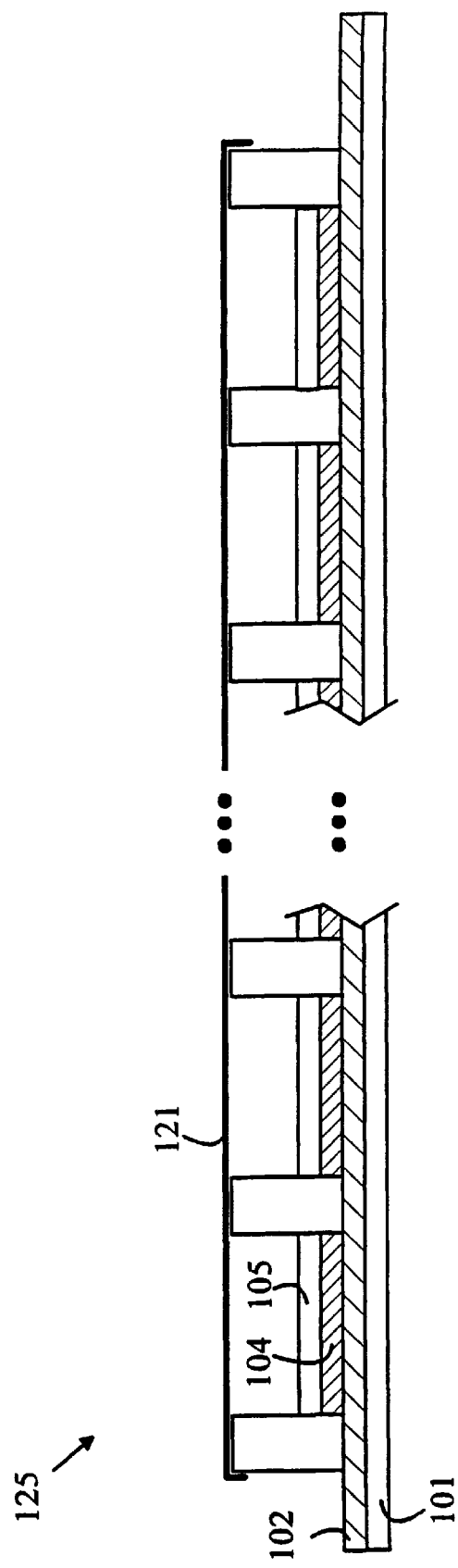
FIG. 2 is a cross-sectional view of the starting material on which a display according to the present invention is preferably constructed.

Refer now to FIG. 2, which is a cross-sectional view of the starting material 125 on which a display according to the present invention is preferably constructed. In the preferred embodiment of the present invention, the substrate and electrode layer together with the wells defined by the boundary walls are provided as a starting material with the cathode and electron transport layers, 104 and 105, pre-deposited in the wells. A protective oxygen/water impermeable sheet 121 covers the top of the wells. This sheet is removed prior to placing the starting sheet in an apparatus that dispenses the electroluminescent layer 108 and hole transport layer 107.

In general, a plurality of electroluminescent materials must be used for the various pixels to provide a multicolor display. The ratio of the various components determines the color emitted by the pixels. The total amount of material deposited determines the intensity of light generated. The present invention makes use of the observation that there are electroluminescent materials that are soluble in solvents that are compatible with dispensing systems that can accurately dispense small amounts of the solvents at precise locations. For example, the three primary colors may be generated from polyflourenes dissolved in an appropriate solvent with dopants to provide the colors. These compounds may be dissolved in xylene. The color is determined by the dye used in the doping. Examples of suitable electroluminescent materials are known to those skilled in the art. The reader is referred to "Electroluminescence of doped organic thin films", Tang, et al., J. Applied Physics 55, pp 3610, 1989, which is hereby incorporated by reference, for a more detailed list of suitable materials. For example, the Coumarins and DCM compounds disclosed therein provide emissions in the blue-green and orange-red portions of the spectrum, respectively.

To simplify the following discussion, a fabrication method based on a dispensing system that is analogous to the mechanism used in inkjet printers will be described. However, it will be obvious to those skilled in the art from the following discussion that other types of dispensers may be utilized without departing from the teachings of the present invention. An inkjet printer dispenses small droplets by propelling the droplets from a nozzle. In one system, the droplets are propelled by vaporizing part of the liquid and using the vaporized liquid to propel the droplet toward the receiving surface. Resolutions of 1400 droplets per inch are commonly achieved with inexpensive printer mechanisms.

Referring again to FIG. 1, each pixel location consists of a well which is to receive one or more droplets of electroluminescent material. The droplets 138 are dispensed into the wells by a dispenser 136, which moves with respect to the display being fabricated on a rail 137. As noted above, dispenser 136 includes a plurality of reservoirs 139, one for each electroluminescent material to be dispensed. In addition, dispenser 139 may include reservoirs for dispensing the materials used to produce the hole transport layers discussed below as well as the final electrode. The electroluminescent materials are preferably electroluminescent dyes that are dissolved in a carrier liquid. In the embodiment shown in FIG. 1, three color reservoirs are utilized. As the reservoirs pass over the wells, controller 135 dispenses droplets into the well in accordance with a predetermined pattern that is stored in controller 135. In essence, controller 135 prints the pixel pattern on the masked bottom electrode. Mask 103 prevents the droplets from running into one another.

After the droplets have dried, a hole transport layer (HTL) 107 is generated by dispensing an appropriate hole transport material into each well. A top electrode 109 is then deposited over the hole transport layer to provide the electrical connections needed to power the device. The hole transport layer 107 may be constructed from a plurality of layers having different conduction bands that more optimally match the energy band of the electroluminescent layer (EL) to the top electrode material. In the preferred embodiment of the present invention, the top electrode is transparent. For example, the top electrode may be constructed from indium tin oxide (ITO). A second flexible substrate layer may be provided over the top electrode to further protect the display from water/oxygen.

As noted above, the HTL layer can be constructed from one or more polymer layers or other small molecule organics. For example, the HTL layer may comprise any suitable organic conductor of holes, such as tertiary amine or carbazole derivatives both in their small molecule or their polymer form, conducting polyaniline (Pani), polyethylenedioxythiophene-polystyrenesulfonate (PEDOT:PSS), thiophenes, metal-base or metal-free phthalocyanines, and many other suitable materials that will be known to those of ordinary skill in the art.

An EL layer may be constructed from a polymer blend based on polyfluorenes and PPV derivatives or other similar polymers as described in U.S. Pat. Nos. 5,776,623, and 5,777,070 and 5,869,350. These polymers are soluble in xylenes, and are not soluble in water, acetone, or isopropyl alcohol. Hence, the EL layer can be deposited on the cathode metal without introducing water.

In another case the electroluminescent layer may comprise small molecule materials such as $Alq_3$ and other similar materials as described in U.S. Pat. Nos. 5,608,287 and 5,708,130, which are incorporated herein by reference.

In general, the final display will also have "dark" regions in addition to the various light-emitting pixels. If the hole transport layer or electron transport layers also emit light, an electrical insulating material can be deposited in the pixels corresponding to the dark regions. The insulating material can be deposited in the same pass as that used to deposit the electroluminescent materials into the other wells. That is, a fourth dispenser can be provided to provide the insulating material. In addition to preventing the dark areas from generating light in the hole and electron transport layers, the insulating material will lower the power consumption of the final display.

As noted above, the flexible substrate 101 preferably inhibits both the flow of oxygen and water. The substrate can be constructed from a flexible material such as poly (ethylene terephthalate) or PET, which is commonly called polyester, poly (ethylene naphthalate), or transparent polyimide. PET is used as a command substrate for Web processing. Unfortunately, PET has a water permeability that is so high that devices constructed thereon begin to degrade almost immediately due to the reaction of water from the air with the cathode material. Accordingly, some form of sealant coating must be applied to the polymer to achieve the required resistance to water and oxygen.

One such coating technique is the Polymer Multilayer (PML) technique described in U.S. Pat. Nos., 4,842,893, 4,954,371, and 5,260,095, which are hereby incorporated by reference. In this technique, a coating consisting of a layer of polymer and a layer of an aluminum oxide is applied to the flexible substrate to seal the substrate. Both the deposition steps can be operated on Web processing equipment at very high speeds. The resultant substrate has a resistance to water and oxygen permeation that is improved by three to four orders of magnitude relative to uncoated PET films.

While the above described embodiments utilized an inkjet printer mechanism for dispensing the electroluminescent dyes, it will be apparent to those skilled in the art from the above discussion that other dispensers may be utilized without departing from the teachings of the present invention. For example, dispensers based on vibrating nozzles are known to the art. In these devices the liquid leaving the vibrating nozzle breaks up into small droplets which are deflected by an electrostatic field. Similarly, dispensers based on micro-pipettes are known in the art. Other ink dispensers such as those used in pen plotters may also be utilized.

Likewise, dispensers comprising an array of micro-pipettes for replicating a pattern stored in a two dimensional array of wells are known in the liquid handling arts utilized by biochemistry and microbiology. In this case, the pattern of pixels is stored in the master array of wells and is replicated on each of the devices utilizing the array of micro-pipettes. This technology is most applicable for displays having large pixels.

The above-described embodiments of the present invention utilized walls to confine the droplets of electroluminescent materials. However, it will be apparent to those skilled in the art from this discussion that other forms of containment can be utilized. For example, the surface on which the droplets are deposited can be arranged in a plurality of hydrophilic or hydrophobic regions so that the droplets are confined by surface tension.

The above-described embodiments of the present invention have utilized "pixels" which are in the form of dots. However, other configurations can be utilized. For example, display elements that are lines or more complex structures can also be utilized. Such complex elements can be used as sub-images or components of images.

Figure 3:
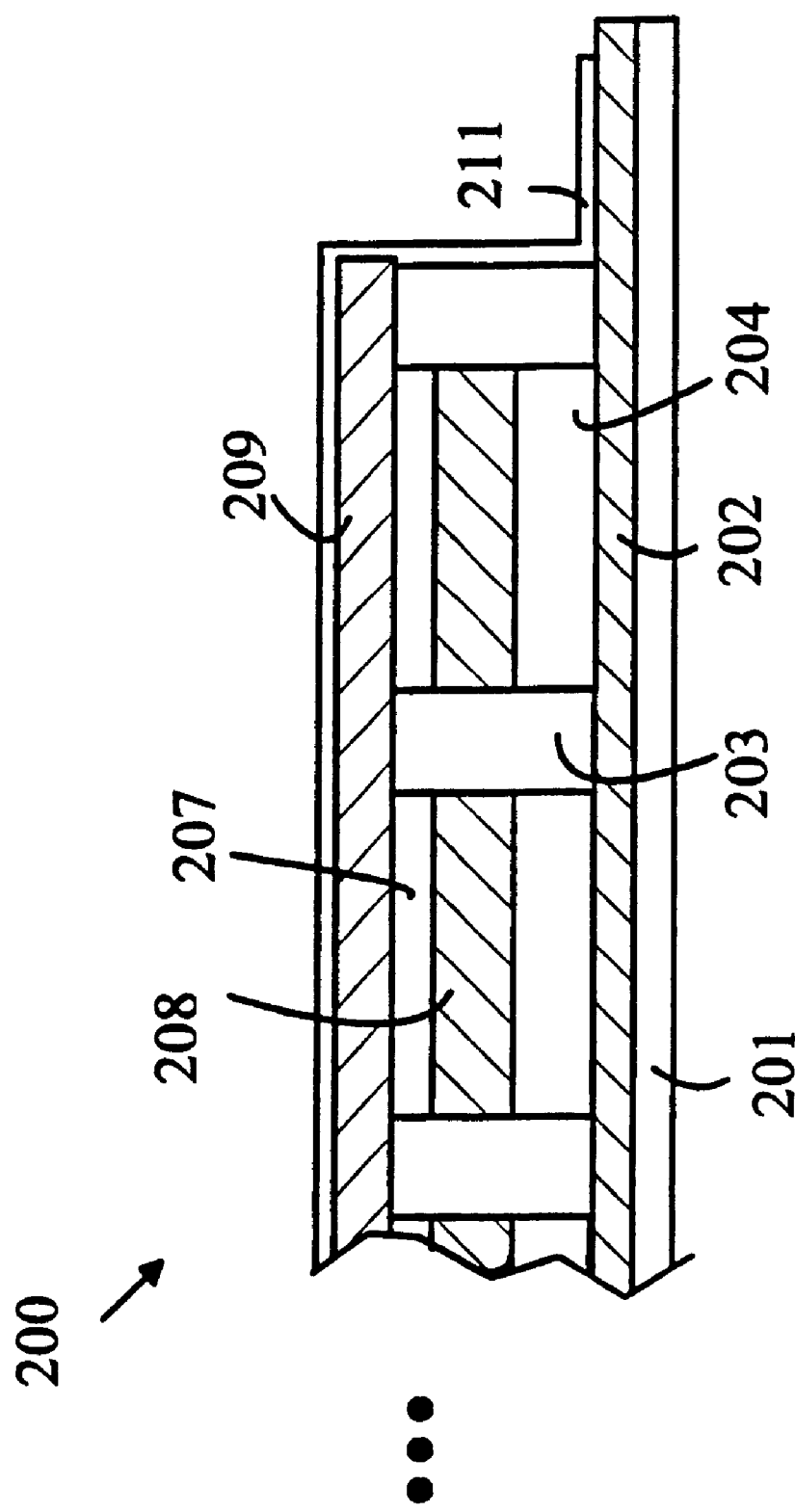
FIG. 3 is a cross-sectional view of another embodiment of a display according to the present invention.

The above-described embodiments of the present invention utilize a design in which the cathode material is provided in the starting material thereby eliminating the need for dispensing this material as part of the fabrication process. These embodiments are preferred because the cathode material is highly reactive, and hence, must be deposited under vacuum or in an inert atmosphere. If the printing processor has vacuum sputtering equipment then embodiments of the present invention in which the anode material is deposited first can be practiced. A cross-sectional view of a completed display 200 according to this embodiment of the present invention is shown in FIG. 3. In such an embodiment, a layer of a transparent conducting oxide 202 such as ITO is deposited on the flexible substrate 201. This anode layer can be deposited in the bottom of the wells defined by barrier layer 203 as described above or in place of the conducting layer under the boundary walls as shown in FIG. 3. The hole transport material 204 is then deposited on this layer. A prefabricated sheet with the flexible substrate having the wells and anode can be provided as a starting material in a manner analogous to that described above. The printing process then proceeds as discussed above by dispensing the electroluminescent material 208 into each of the wells. After the dispensed material has dried, an electron transport material 207 is applied over the top of each well. The sheet is then transferred to a vacuum deposition apparatus and the cathode material 209 is applied over the electron transport material layer. A protective coating 211 is then applied over the cathode material to protect the cathode material. The various materials described above with respect to the embodiments discussed with reference to FIGS. 1 and 2 may be utilized to implement this embodiment of the present invention.

The above-identified embodiments have utilized hole transport and/or electron transport layers. However, it will be obvious to those skilled in the art from the preceding discussion that embodiments in which these layers are omitted may also be practiced if the energy bands of the electroluminescent layer are positioned such that the efficiency of holes and/or electrons from the relevant electrode into the electroluminescent layer is acceptable.

Various modifications to the present invention will become apparent to those skilled in the art from the foregoing description and accompanying drawings. Accordingly, the present invention is to be limited solely by the scope of the following claims.

What is claimed is:

1. A method for fabricating an electroluminescent display, said method comprising:

providing a substrate comprising a flexible base layer having a conducting surface on one side thereof, said base layer being at least 1000 times less permeable to oxygen and water than a PET film of the same thickness as said base layer, said substrate further comprising a plurality of wells defined by a barrier layer, each of said wells having an electrode layer connected electrically with said conducting surface;

moving a first dispenser relative to said substrate so as to quantitatively deposit a first electroluminescent material on said substrate, different amounts of said first electroluminescent material being deposited at different locations on said substrate in response to signals defining an illumination pattern to be generated by said display; and depositing a conducting material on said first electroluminescent material.

2. The method of claim 1, further comprising the step of quantitatively depositing a second electroluminescent material on said substrate, said second electroluminescent material emitting light at a different wavelength than said first electroluminescent material.

3. The method of claim 1, wherein said conducting material comprises a hole transport material that facilitates the injection of holes into said first electroluminescent material.

4. The method of claim 1, wherein said conducting material comprises an electron transport material that facilitates the injection of electrons into said first electroluminescent material.

5. The method of claim 1, further comprising the step of depositing a non-luminescent material on said substrate at locations on said display that are not to emit light prior to depositing said conductive material.

6. The method of claim 5, wherein said non-luminescent material is an electrical insulator.

* * * * *